US011334431B2

(12) United States Patent
Li

(10) Patent No.: US 11,334,431 B2
(45) Date of Patent: May 17, 2022

(54) SYSTEM AND METHOD FOR DATA PROTECTION IN SOLID-STATE DRIVES

(71) Applicant: ALIBABA GROUP HOLDING LIMITED, Grand Cayman (KY)

(72) Inventor: Shu Li, San Mateo, CA (US)

(73) Assignee: Alibaba Group Holding Limited, Grand Cayman (KY)

(*) Notice: Subject to any disclaimer, the term of this patent is extended or adjusted under 35 U.S.C. 154(b) by 0 days.

(21) Appl. No.: 17/026,761

(22) Filed: Sep. 21, 2020

(65) Prior Publication Data
US 2022/0091930 A1  Mar. 24, 2022

(51) Int. Cl.
G06F 11/00 (2006.01)
G06F 11/10 (2006.01)
H03M 13/15 (2006.01)

(52) U.S. Cl.
CPC ....... *G06F 11/1068* (2013.01); *H03M 13/154* (2013.01)

(58) Field of Classification Search
None
See application file for complete search history.

(56) References Cited

U.S. PATENT DOCUMENTS

| 8,769,380 B1 * | 7/2014 | Burd | H03M 13/3715 |
| | | | 714/774 |
| 10,536,172 B2 * | 1/2020 | Ilani | G06F 11/1012 |
| 10,860,420 B2 * | 12/2020 | Li | H03M 13/2927 |
| 2003/0172328 A1 * | 9/2003 | Wyatt | G06F 11/0727 |
| | | | 714/704 |
| 2014/0019824 A1 * | 1/2014 | Varanasi | H03M 13/1111 |
| | | | 714/758 |
| 2020/0373943 A1 * | 11/2020 | Cho | G06F 3/0619 |

OTHER PUBLICATIONS

R.-S. Liu, M.-Y. Chuang, C.-L. Yang, C.-H. Li, K.-C. Ho and H.-P. Li, "Improving Read Performance of NAND Flash SSDs by Exploiting Error Locality," in IEEE Transactions on Computers, vol. 65, No. 4, pp. 1090-1102, Apr. 1, 2016, doi: 10.1109/TC.2014.2345387. (Year: 2016).*

* cited by examiner

*Primary Examiner* — Daniel F. McMahon
(74) *Attorney, Agent, or Firm* — Finnegan, Henderson, Farabow, Garrett & Dunner, LLP

(57) ABSTRACT

The present disclosure relates to a system and a method for data protection. In some embodiments, an exemplary method for data encoding includes: receiving a data bulk; performing an erasure coding (EC) encoding on the data bulk to generate one or more EC codewords; distributing a plurality of portions of each EC codeword of the one or more EC codewords across a plurality of solid-state drives (SSDs); performing, at each SSD of the plurality of SSDs, an error correction coding (ECC) encoding on portions of the one or more EC codewords distributed to the SSD to generate an ECC codeword; and storing, in each SSD of the plurality of SSDs, the ECC codeword.

8 Claims, 9 Drawing Sheets

SYSTEM AND METHOD FOR DATA PROTECTION IN SOLID-STATE DRIVES

BACKGROUND

All modern-day computers have some form of secondary storage for long-term storage of data. Traditionally, hard disk drives (HDDs) were used for this purpose, but computer systems are increasingly turning to solid-state drives (SSDs) as their secondary storage unit. SSDs have many superior characteristics compared to HDDs, most prominently having vastly lower latency and vastly greater transfer speed. But high error rate in SSDs results in read/write failure and data loss. Therefore, data protection (e.g., error reduction and correction) in SSDs is still challenging.

SUMMARY

In some embodiments, an exemplary method for data encoding can include: receiving a data bulk; performing an erasure coding (EC) encoding on the data bulk to generate one or more EC codewords; distributing a plurality of portions of each EC codeword of the one or more EC codewords across a plurality of solid-state drives (SSDs); performing, at each SSD of the plurality of SSDs, an error correction coding (ECC) encoding on portions of the one or more EC codewords distributed to the SSD to generate an ECC codeword; and storing, in each SSD of the plurality of SSDs, the ECC codeword.

In some embodiments, an exemplary apparatus for data encoding includes at least one memory for storing instructions and at least one processor. At least one processor can be configured to execute the instructions to cause the apparatus to perform: receiving a data bulk; performing an EC encoding on the data bulk to generate one or more EC codewords; distributing a plurality of portions of each EC codeword of the one or more EC codewords across a plurality of SSDs; performing, at each SSD of the plurality of SSDs, an ECC encoding on portions of the one or more EC codewords distributed to the SSD to generate an ECC codeword; and storing, in each SSD of the plurality of SSDs, the ECC codeword.

In some embodiments, an exemplary non-transitory computer readable storage medium storing a set of instructions that are executable by one or more processing devices to cause a computer to perform: receiving a data bulk; performing an EC encoding on the data bulk to generate one or more EC codewords; distributing a plurality of portions of each EC codeword of the one or more EC codewords across a plurality of SSDs; performing, at each SSD of the plurality of SSDs, an ECC encoding on portions of the one or more EC codewords distributed to the SSD to generate an ECC codeword; and storing, in each SSD of the plurality of SSDs, the ECC codeword.

In some embodiments, an exemplary method for data decoding can include: initiating an error correction coding (ECC) decoding on an ECC codeword to generate decoded data; determining whether the ECC decoding on the ECC codeword has succeeded or failed; in response to a determination that the ECC decoding has failed, initiating an erasure coding (EC) decoding on a first EC codeword of a plurality of EC codewords, each EC codeword corresponding to an ECC data portion of the ECC codeword; determining whether the EC decoding on the first EC codeword has succeeded or failed; in response to a determination that the EC decoding has succeeded, resuming the ECC decoding on the ECC codeword; and in response to a determination that the ECC decoding has succeeded, outputting the decoded data.

Additional features and advantages of the present disclosure will be set forth in part in the following detailed description, and in part will be obvious from the description, or may be learned by practice of the present disclosure. The features and advantages of the present disclosure will be realized and attained by means of the elements and combinations particularly pointed out in the appended claims.

It is to be understood that the foregoing general description and the following detailed description are exemplary and explanatory only, and are not restrictive of the disclosed embodiments.

BRIEF DESCRIPTION OF THE DRAWINGS

The accompanying drawings, which comprise a part of this specification, illustrate several embodiments and, together with the description, serve to explain the principles and features of the disclosed embodiments. In the drawings.

DETAILED DESCRIPTION

Figure 1:
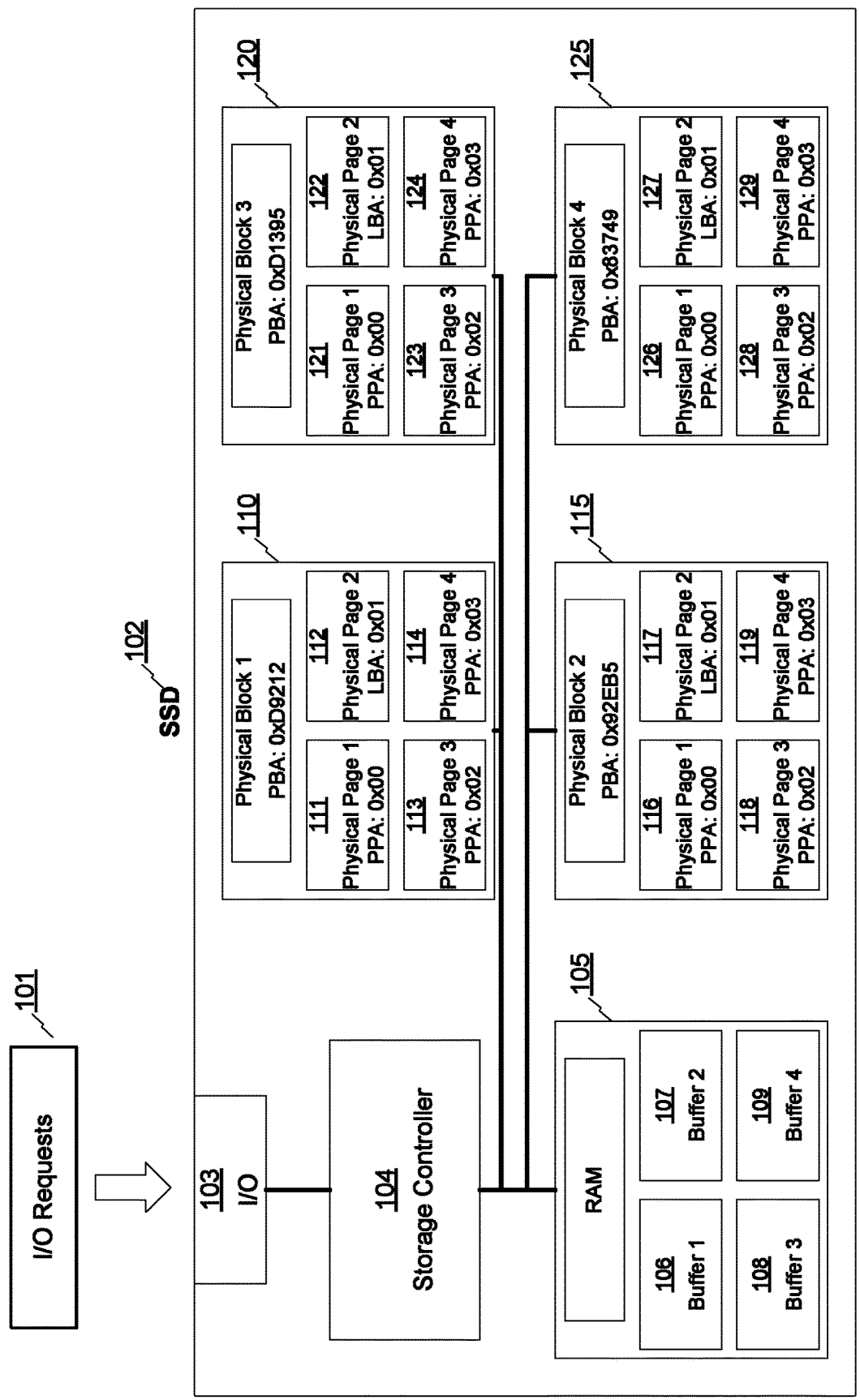
FIG. 1 illustrates a schematic representation of an exemplary simplified internal structure of an SSD, according to some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems and methods consistent with aspects related to the invention as recited in the appended claims.

Modern day computers are based on the Von Neuman architecture. As such, broadly speaking, the main components of a modern-day computer can be conceptualized as two components: something to process data, called a processing unit, and something to store data, called a primary storage unit. The processing unit (e.g., CPU) fetches instructions to be executed and data to be used from the primary storage unit (e.g., RAM), performs the requested calculations, and writes the data back to the primary storage unit. Thus, data is both fetched from and written to the primary storage unit, in some cases after every instruction cycle. This means that the speed at which the processing unit can read from and write to the primary storage unit can be important to system performance. Should the speed be insufficient, moving data back and forth becomes a bottleneck on system performance. This bottleneck is called the Von Neumann bottleneck.

Thus, high speed and low latency are factors in choosing an appropriate technology to use in the primary storage unit. Modern day systems typically use DRAM. DRAM can transfer data at dozens of GB/s with latency of only a few nanoseconds. However, in maximizing speed and response time, there can be a tradeoff. DRAM has three drawbacks. DRAM has relatively low density in terms of amount of data stored, in both absolute and relative measures. DRAM has a much lower ratio of data per unit size than other storage technologies and would take up an unwieldy amount of space to meet current data storage needs. DRAM is also significantly more expensive than other storage media on a price per gigabyte basis. Finally, and most importantly, DRAM is volatile, which means it does not retain data if power is lost. Together, these three factors make DRAM not as suitable for long-term storage of data. These same limitations are shared by most other technologies that possess the speeds and latency needed for a primary storage device.

Thus, in addition to having a processing unit and a primary storage unit, modern-day computers also have a secondary storage unit. What differentiates primary and secondary storage is that the processing unit has direct access to data in the primary storage unit, but not the secondary storage unit. Rather, to access data in the secondary storage unit, the data from the second storage unit is first transferred to the primary storage unit. This forms a hierarchy of storage, where data is moved from the secondary storage unit (non-volatile, large capacity, high latency, low bandwidth) to the primary storage unit (volatile, small capacity, low latency, high bandwidth) to make the data available to process. The data is then transferred from the primary storage unit to the processor, perhaps several times, before the data is finally transferred back to the secondary storage unit. Thus, like the link between the processing unit and the primary storage unit, the speed and response time of the link between the primary storage unit and the secondary storage unit assists with system performance. Should its speed and responsiveness prove insufficient, moving data back and forth between the memory unit and secondary storage unit can also become a bottleneck on system performance.

Traditionally, the secondary storage unit in a computer system was HDD. HDDs are electromechanical devices, which store data by manipulating the magnetic field of small portions of a rapidly rotating disk composed of ferromagnetic material. But HDDs have several limitations that make them less favored in modern day systems. In particular, the transfer speeds of HDDs are largely stagnated. The transfer speed of an HDD is largely determined by the speed of the rotating disk, which begins to face physical limitations above a certain number of rotations per second (e.g., the rotating disk experiences mechanical failure and fragments). Having largely reached the current limits of angular velocity sustainable by the rotating disk, HDD speeds have mostly plateaued. However, CPU's did not face a similar limitation.

As the amount of data accessed continued to increase, HDD speeds increasingly became a bottleneck on system performance. This led to the search for and eventually introduction of a new memory storage technology.

The storage technology ultimate chosen was flash memory. Flash storage is composed of circuitry, principally logic gates composed of transistors. Since flash storage stores data via circuitry, flash storage is a solid-state storage technology, a category for storage technology that doesn't have (mechanically) moving components. A solid-state based device has advantages over electromechanical devices such as HDDs, because solid-state devices does not face the physical limitations or increased chances of failure typically imposed by using mechanical movements. Flash storage is faster, more reliable, and more resistant to physical shock. As its cost-per-gigabyte has fallen, flash storage has become increasingly prevalent, being the underlying technology of flash drives, SD cards, the non-volatile storage unit of smartphones and tablets, among others. And in the last decade, flash storage has become increasingly prominent in PCs and servers in the form of SSDs.

SSDs are, in common usage, secondary storage units based on flash technology. Technically referring to any secondary storage unit that doesn't involve mechanically moving components, SSDs are almost exclusively made using flash technology. As such, SSDs do not face the mechanical limitations encountered by HDDs. SSDs have many of the same advantages over HDDs as flash storage such as having significantly higher speeds and much lower latencies.

As a basic overview, SSDs are made using floating gate transistors, strung together in strings. Strings are then laid next to each other to form two dimensional matrixes of floating gate transistors, referred to as blocks Running transverse across the strings of a block (so including a part of every string), is a page. Multiple blocks are then joined together to form a plane, and multiple planes are formed together to form a NAND die of the SSD, which is the part of the SSD that permanently stores data. Blocks and pages are typically conceptualized as the building blocks of an SSD, because pages are the smallest unit of data which can be written to an read from, while blocks are the smallest unit of data that can be erased.

FIG. 1 illustrates a schematic representation of an exemplary simplified internal structure of an SSD 102, according to some embodiments of the present disclosure. Specifically, FIG. 1 shows how an SSD 102 is composed of an I/O interface 103 through which the SSD communicates to the host system. Connected to the I/O interface 103 is the storage controller 104, which contains processors that control the functionality of the SSD. Storage controller 104 is connected to RAM 105, which contains multiple buffers, shown here as buffers 106, 107, 108, and 109. Storage controller 104 is then shown as being connected to physical blocks 110, 115, 120, and 125. As shown by physical block 110, each physical block has a physical block address (PBA), which uniquely identifies the physical block. Also shown by physical block 110 is that each physical block is made up of physical pages, which, for physical block 110, are physical pages 111, 112, 113, and 114. Each page also has its own physical page address (PPA), which is unique within its block. Together, the physical block address along with the physical page address uniquely identifies a page—analogous to combining a 7-digit phone number with its area code. Omitted from FIG. 1 are planes of blocks. In an actual SSD, a storage controller is connected not to physical blocks, but to planes, each of which is composed of physical blocks.

Figure 2:
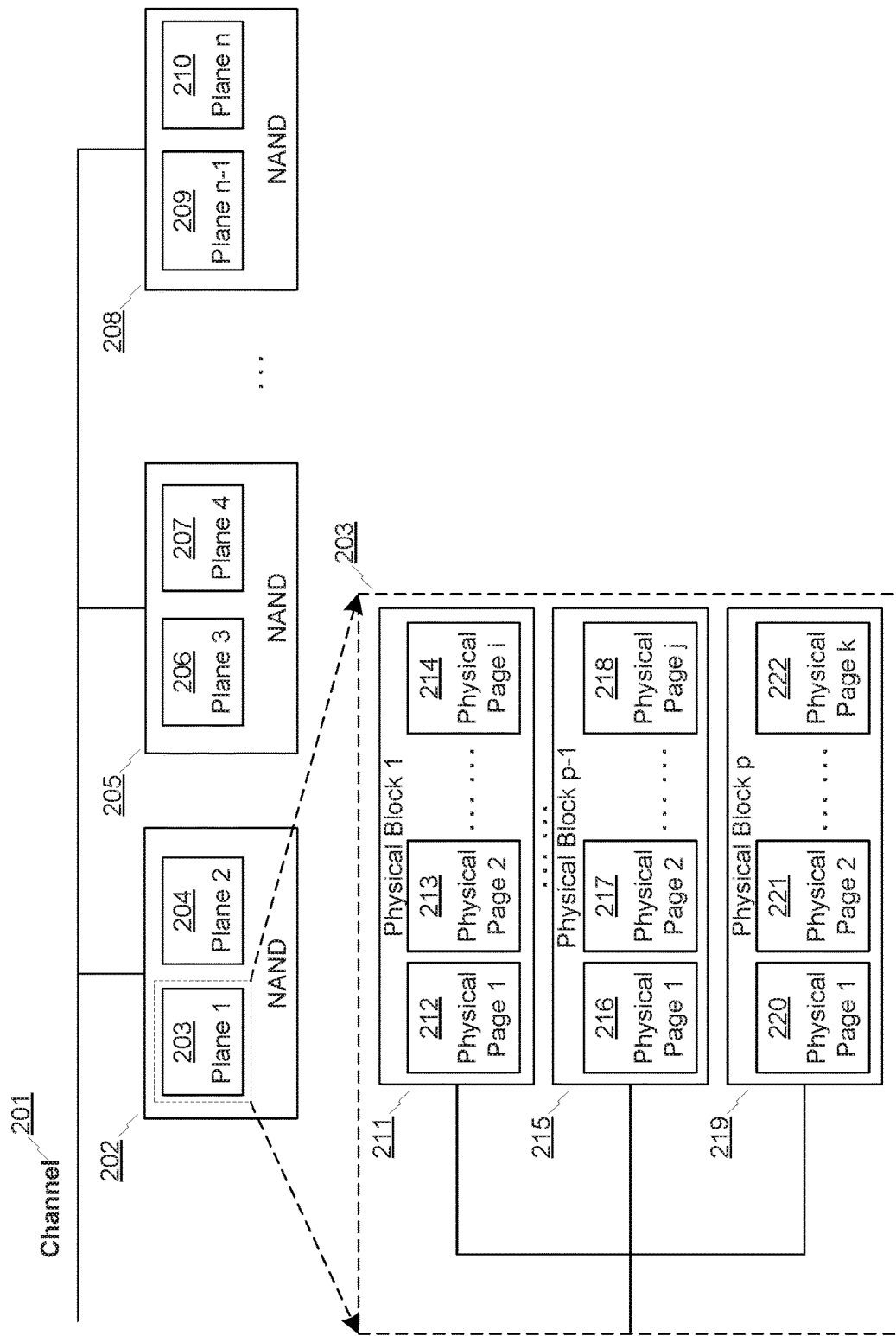
FIG. 2 illustrates a schematic representation of the basic layout of an exemplary internal structure of a NAND subcomponent of an SSD, according to some embodiments of the present disclosure.

FIG. 2 illustrates a schematic representation of the basic layout of an exemplary internal structure of a NAND subcomponent of an SSD, according to some embodiments of the present disclosure. As stated above, a storage controller (e.g., storage controller 104 of FIG. 1) of an SSD is connected with one or more NAND flash integrated circuits (ICs), which is where any data received by the SSD is ultimately stored. Each NAND IC 202, 205, and 208 typically contains one or more planes. Using NAND IC 202 as an example, NAND IC 202 includes planes 203 and 204. As stated above, each plane is then composed of multiple physical blocks. For example, plane 203 is composed of physical blocks 211, 215, and 219. Each physical block is then further composed of physical pages, which, for physical block 211, are physical pages 212, 213, and 214.

Generally, NAND flash includes single-level cell (SLC), multi-level cell (MLC), triple-level cell (TLC), and quadruple-level cell (QLC). A SLC can only store one bit per cell and take up to two levels of charge. MLC can store 2 bits per cell and take up to four levels of charge. TLC can store 3 bits per cell for up to eight levels of charge. QLC can store 4 bits per cell and take up to 16 levels of charge. However, limited endurance of NAND flash (e.g., QLC NAND flash) serves as a non-trivial obstacle for broad usage even with ECC (e.g., low density parity check (LDPC)) code. With increase of program/erase (P/E) cycles, NAND flash cell deteriorates with high raw error rate due to various reasons including data retention, coupling effect, or the like. Some embodiments of the present disclosure can improve data protection in SSD and thus reduce the error rate.

Figure 3:
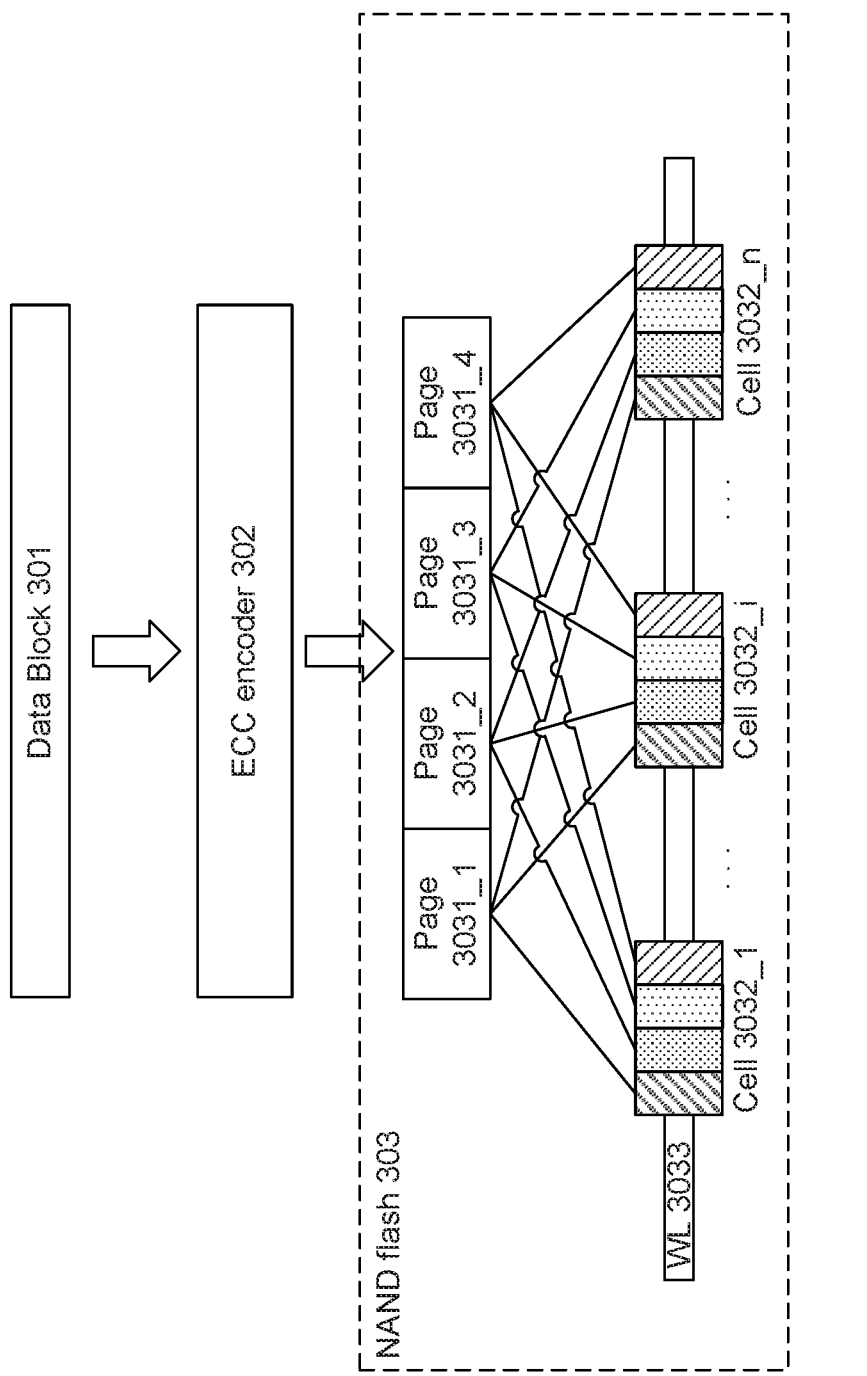
FIG. 3 illustrates a schematic representation of an exemplary write process to a quadruple-level cell (QLC) NAND flash.

FIG. 3 illustrates a schematic representation of an exemplary write process 300. It is appreciated that, write process 300 can be implemented by SSD 102 of FIG. 1, NAND IC 202, 205, or 208 of FIG. 2.

As shown in FIG. 3, a data block 301 can be input into an ECC encoder 302 that can perform ECC encoding on data block 301. For example, ECC encoder 302 can perform a variable-rate low-density parity-check (LDPC) encoding on data block 301 and generates ECC codewords. ECC encoder 302 can output the ECC codewords to a QLC NAND flash 303 for storage. QLC NAND flash 303 can include a plurality of pages, e.g., page 3031_1, page 3031_2, page 3031_3, and page 3031_4. Each page 3031 can include a plurality of QLCs, e.g., cell 3032_1, ... cell 3032_i, ..., and cell 3032_n, that are connected by wordline (WL) 3033. QLC NAND flash 303 can store received ECC codewords in page 3031_1, page 3031_2, page 3031_3, and page 3031_4.

To avoid an open wordline that may affect data reliability, QLC NAND flash 303 can limit a size of I/O block (e.g., data block 301). For example, the size of I/O block can be limited to be larger than 64 KB. Then, one wordline (e.g., WL 3033) has 4 pages (e.g., page 3031_1, page 3031_2, page 3031_3, and page 3031_4), and each page can individually store 16 KB. This size limitation may deteriorate random access performance with small I/O size such as 4 KB. Moreover, endurance of a QLC NAND flash is lower than that of a TLC NAND flash, and even strong ECC like LDPC cannot significantly improve the endurance. In addition, strong ECC may increases latency to handle raw bit error rate through multiple retry combinations with finer-grained sensing, soft decoding, iterative processing, or the like.

Figure 4:
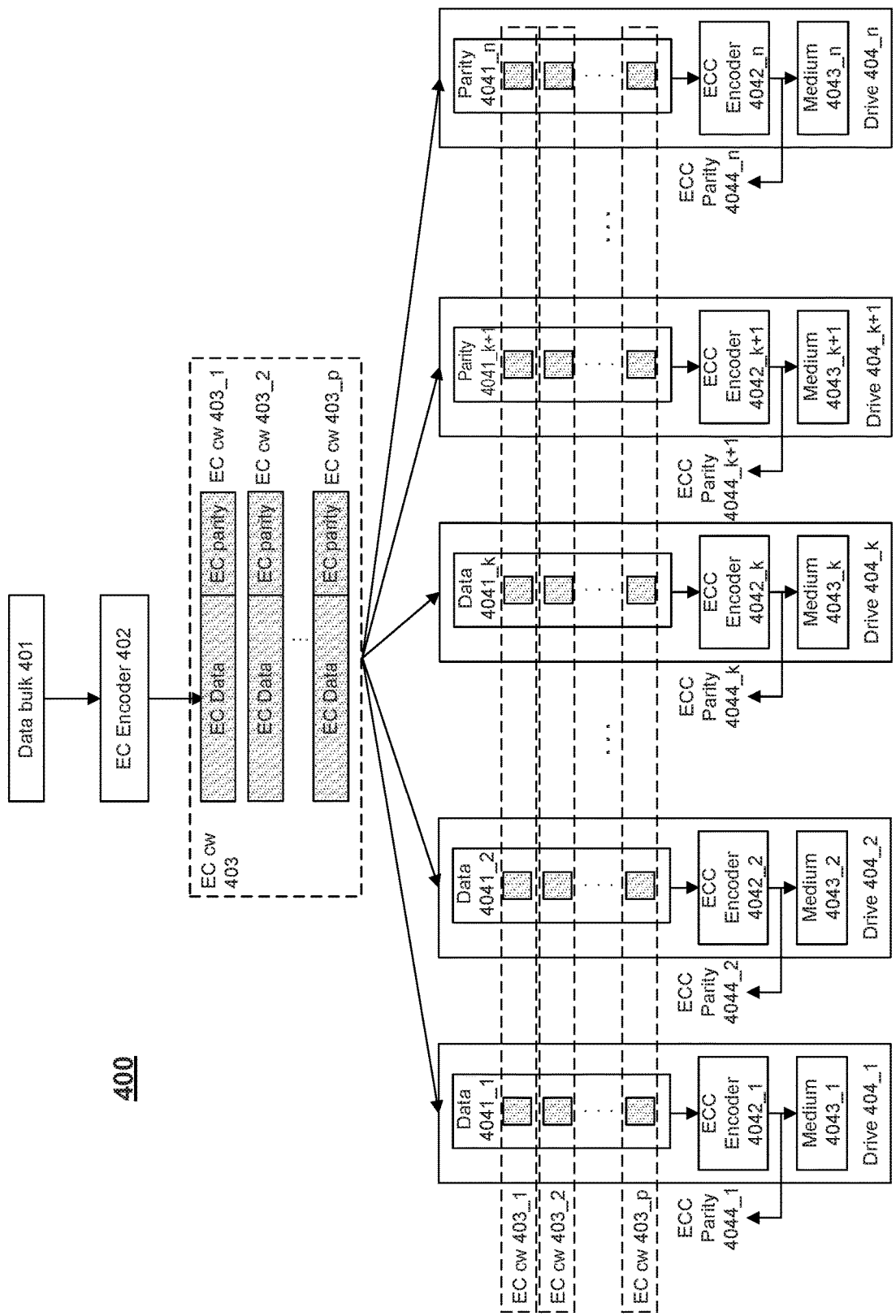
FIG. 4 illustrates a schematic representation of an exemplary encoding system, according to some embodiments of the present disclosure.

FIG. 4 illustrates a schematic representation of an exemplary encoding system 400, according to some embodiments of the present disclosure. It is appreciated that, encoding system 400 can be implemented, at least in part, by SSD 102 of FIG. 1, NAND IC 202, 205, or 208 of FIG. 2, or NAND flash 303 of FIG. 3.

As shown in FIG. 4, encoding system 400 can include an erasure coding (EC) encoder 402 and a plurality of drives 404, e.g., drive 404_1, drive 404_2, ..., drive 404_k, drive 404_k+1, ..., drive 404_n, coupled to EC encoder 402. EC encoder 402 can receive a data bulk 401 which can include a plurality of data blocks (e.g., data block 301). EC encoder 402 can perform an EC encoding on received data bulk 401 and generate one or more EC codewords (cw) 403. In general, EC encoder 402 can be implemented by hardware, software, firmware, or a combination thereof and located in a host unit (e.g., a CPU) or a storage controller (e.g., storage controller 104 of FIG. 1). For example, EC encoder 402 can have circuitry configured to encode data bulk 401 and generate one or more EC codewords 403. In some embodiments, EC codewords 403 can include a plurality of EC codewords, e.g., EC codeword 403_1, EC codeword 403_2, ..., and EC codeword 403_p. Each EC codeword can include an EC data and an EC parity.

EC codewords 403 can be stored in a plurality of drives 404, e.g., drive 404_1, drive 404_2, ..., drive 404_k, drive 404_k+1, ..., drive 404_n. Drive 404 can be implemented by an SSD (e.g., SSD 102 of FIG. 1) that includes a plurality of NAND ICs (e.g., NAND IC 202, 205, and 208 of FIG. 2). Drive 404 can include a buffer 4041 (e.g., buffer 4041_1, buffer 4041_2, ..., or buffer 4041_n), an ECC encoder 4042 (e.g., ECC encoder 4042_1, ECC encoder 4042_2, ..., or ECC encoder 4042_n), and a medium 4043 (e.g., medium 4043_1, medium 4043_2, ..., or medium 4043_n). Buffer 4041 can temporarily store information received from outside, e.g., EC data or EC parity of the EC codeword 403 (e.g., EC codeword 403_1, EC codeword 403_2, ..., or EC codeword 403_p) received from EC encoder 402. ECC encoder 4042 can perform ECC encoding on received EC data or EC parity of the EC codeword 403 to generate an ECC codeword. ECC encoder 4042 can be implemented by hardware, software, firmware, or a combination thereof. For example, ECC encoder 4042 can have circuitry configured to encode received EC data or EC parity and generate an ECC codeword. Medium 4043 can be used to store the ECC codeword. Medium 4043 can include a plurality of NAND ICs (e.g., NAND IC 202, 205, and 208 of FIG. 2). The NAND IC can be an SLC NAND IC, an MLC NAND IC, a TLC NAND IC, or a QLC NAND IC.

As shown in FIG. 4, each EC codeword can be partitioned into n parts and output to n drives 404. For example, the EC data of EC codeword 403_1 can be partitioned into k portions and distributed to drive 404_1, drive 404_2, ..., and drive 404_k, and the EC parity of EC codeword 403_1 can be partitioned into n-k portions and distributed to drive 404_k+1, ..., and drive 404_n. Similarly, the EC data of EC codeword 403_2, ..., and EC codeword 403_p can be partitioned into k portions and distributed to drive 404_1, drive 404_2, ..., and drive 404_k, and their EC parities can be partitioned into n-k portions and distributed to drive 404_k+1, ..., and drive 404_n. Thus, each of drive 404_1, drive 404_2, ..., and drive 404_k can receive p EC data portions from EC codeword 403_1, EC codeword 403_2, ..., and EC codeword 403_p, and store the received p EC data portions in its buffer (e.g., buffer 4041_1, buffer 4041_2, ..., and buffer 4041_k). Each of drive 404_k+1, ..., and drive 404_n can receive p EC parity portions from EC codeword 403_1, EC codeword 403_2, . . . , and EC codeword 403_$p$, and store the received p EC parity portions in its buffer (e.g., buffer 4041_$k$+1, . . . , and buffer 4041_$n$).

ECC encoder 4042 can read EC data portions or EC parity portions of EC codewords from buffer 4041 and perform an ECC encoding (e.g., LDPC encoding) to generate an ECC codeword. For example, ECC encoder 4042_1 can read p EC data portions of EC codewords 403_1 to 403_$p$ from buffer 4041_1 and encode the p EC data portions to generate an ECC codeword. Similarly, ECC encoder 4042_$k$+1 can read p EC parity portions of EC codewords 403_1 to 403_$p$ from buffer 4041_$k$+1 and encode the p EC parity portions to generate an ECC codeword. The ECC codeword can include an ECC data and an ECC parity. ECC encoder 4042_1, ECC encoder 4042_2, . . . , and ECC encoder 4042_$n$ can store respective generated ECC codeword in medium 4043_1, medium 4043_2, . . . , and medium 4043_$n$, respectively. In some embodiments, the ECC parity (e.g., ECC parity 4044_1, ECC parity 4044_2, . . . , ECC parity 4044_$n$) can be collected to generate group parity as described in detail below with reference to FIG. 5.

As shown in FIG. 4, encoding system 400 can encode data bulk 401 with a combination of both EC and ECC and thus provide an improved data protection. It is appreciated that, although ECC encoder 4042 is shown as being located in drive 404 in FIG. 4, it can be incorporated into a host unit (e.g., CPU).

Figure 5:
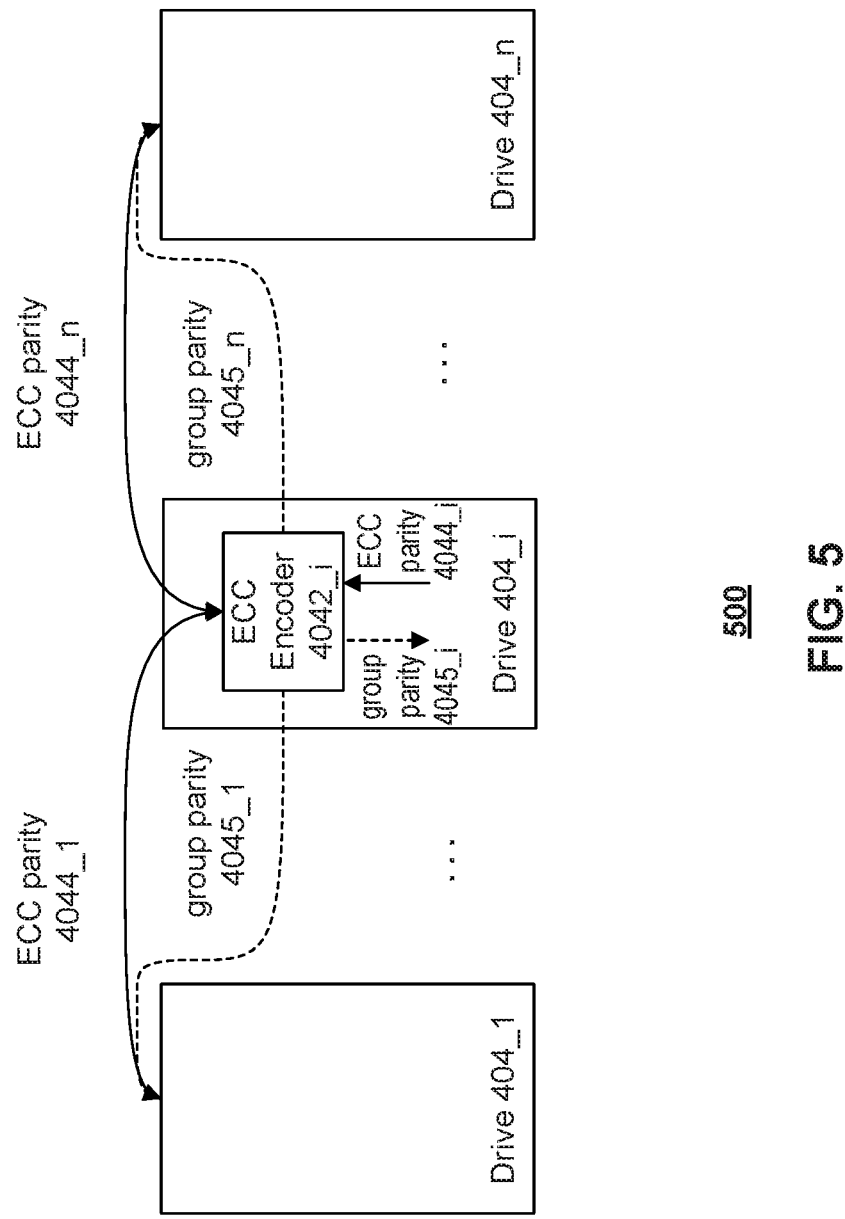
FIG. 5 illustrates a schematic representation of an exemplary group ECC encoding process, according to some embodiments of the present disclosure.

FIG. 5 illustrates a schematic representation of an exemplary group ECC encoding process 500, according to some embodiments of the present disclosure. As shown in FIG. 5, ECC parity 4044_1, ECC parity 4044_2, . . . , ECC parity 4044_$i$-1, ECC parity 4044_$i$+1, ECC parity 4044_$n$ can be collected to a drive 404_$i$. For example, ECC encoder 4042_$i$ of drive 404_$i$ can receive ECC parity 4044_1, ECC parity 4044_2, . . . , ECC parity 4044_$i$-1, ECC parity 4044_$i$+1, ECC parity 4044_$n$ from drive 404_1, drive 404_2, . . . , drive 404_$i$-1, drive 404_$i$+1, . . . , drive 404_$n$, respectively. In some embodiments, ECC encoder 4042_$i$ can read ECC parity 4044_1, ECC parity 4044_2, . . . , ECC parity 4044_$i$-1, ECC parity 4044_$i$+1, ECC parity 4044_$n$ from buffer 4041_$i$ (not shown in FIG. 5) that are collected from other drives. ECC encoder 4042_$i$ can read ECC parity 4044_$i$ from medium 4043_$i$ (not shown in FIG. 5). ECC encoder 4042_$i$ can perform group ECC encoding on ECC parities 4044_1 to 4044_$n$ to generate a group ECC parity. ECC encoder 4042_$i$ can also partition the group ECC parity into n group ECC parity portions, e.g., group parity 4045_1, group parity 4045_2, . . . , and group parity 4045_$n$. The n group ECC parity portions, group parity 4045_1, group parity 4045_2, . . . , and group parity 4045_$n$, can be distributed to and stored in drive 404_1, drive 404_2, . . . , drive 404_$n$, respectively. Each drive 404 can store received group ECC parity portion in medium 4043. In some embodiments, the group ECC parity can be evenly partitioned into n group ECC parity portions with the same size.

Drive 404_$i$ can be selected from drive 404_1, drive 404_2, . . . , and drive 404_$n$ (e.g., by the host unit) to perform the group ECC encoding. In some embodiments, drive 404_$i$ can change for a different round of group ECC encoding. For example, a drive pointer can indicate a drive (e.g., drive 404_$i$) to perform current one or more rounds of group ECC encoding. For next one or more rounds of group ECC encoding, the drive pointer can be moved to another drive (e.g., drive 404=$i$+1). Drive 404_1, drive 404_2, . . . , and drive 404_$n$ can sequentially perform the group ECC encoding one by one. When the drive pointer goes through all drives, it can be moved back to the initial drive (e.g., drive 404_1) and begin next loop of moving.

Figure 6:
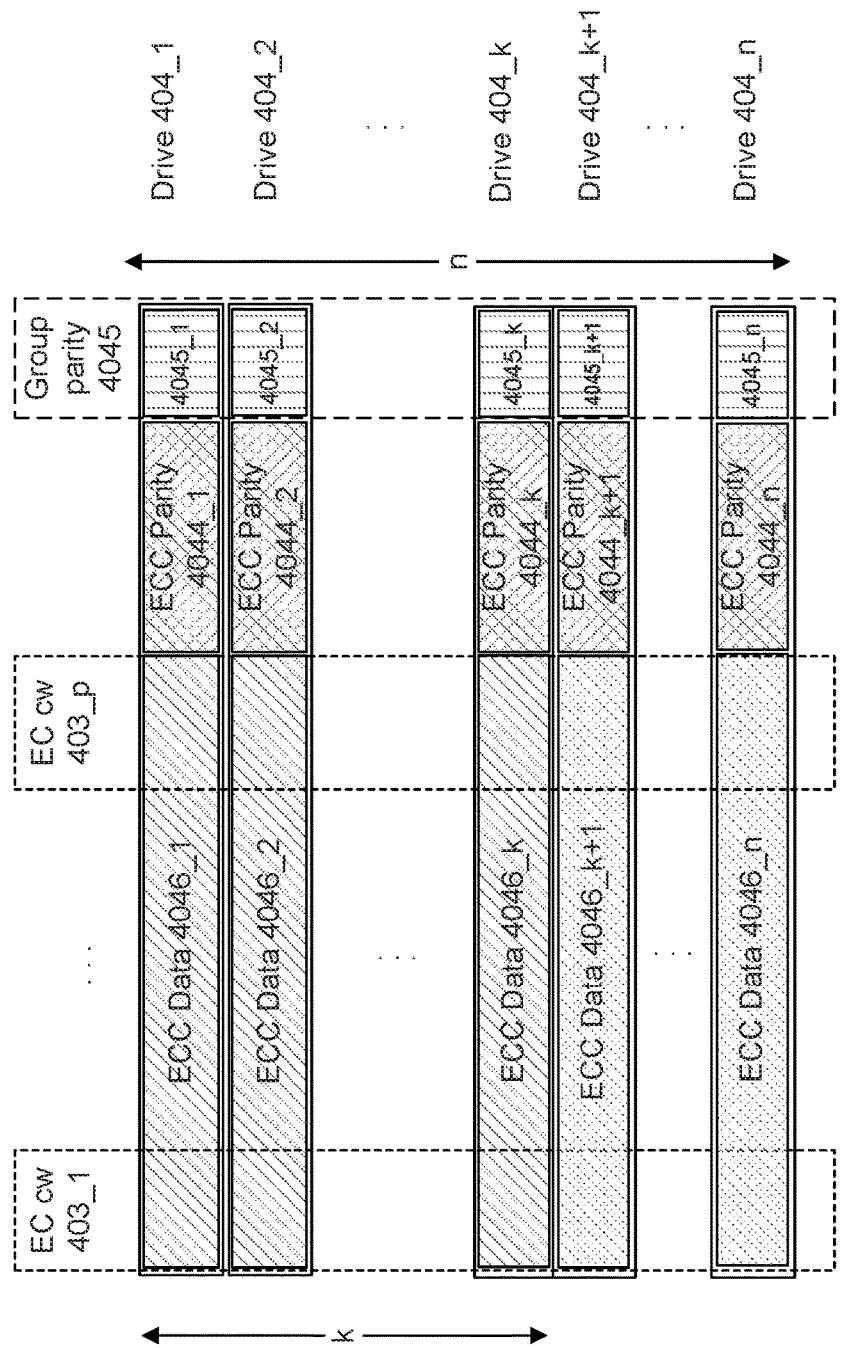
FIG. 6 illustrates a schematic representation of an exemplary data protection structure, according to some embodiments of the present disclosure.

FIG. 6 illustrates a schematic representation of an exemplary data protection structure 600, according to some embodiments of the present disclosure. As shown in FIG. 6, each drive 404 (e.g., drive 404_1, drive 404_2, . . . , or drive 404_$n$) can include an ECC data 4046 (e.g., ECC data 4046_1, ECC data 4046_2, . . . , or ECC data 4046_$n$), ECC parity 4044 (e.g., ECC parity 4044_1, ECC parity 4044_2, . . . , or ECC parity 4044_$n$), group parity 4045 (e.g., group parity 4045_1, group parity 4045_2, . . . , or group parity 4045_$n$). ECC data 4046_1, ECC data 4046_2, . . . , and ECC data 4046_$k$ can correspond to EC data portions of EC codeword 403_1, EC codeword 403_2, . . . , and EC codeword 403_$p$, while ECC data 4046_$k$+1, . . . , and ECC data 4046_$n$ can correspond to EC parity portions of EC codeword 403_1, EC codeword 403_2, . . . , and EC codeword 403_$p$. ECC parity 4044_1, ECC parity 4044_2, . . . , and ECC parity 4044_$n$ can correspond to and constitute ECC codewords with ECC data 4046_1, ECC data 4046_2, . . . , and ECC data 4046_$n$, respectively. Group parity 4045_1, group parity 4045_2, . . . , and group parity 4045_$n$ can constitute group ECC parity determined from ECC parity 4044_1, ECC parity 4044_2, . . . , and ECC parity 4044_$n$. In some embodiment, group parity 4045_1, group parity 4045_2, . . . , and group parity 4045_$n$ can have the same size.

Figure 7:
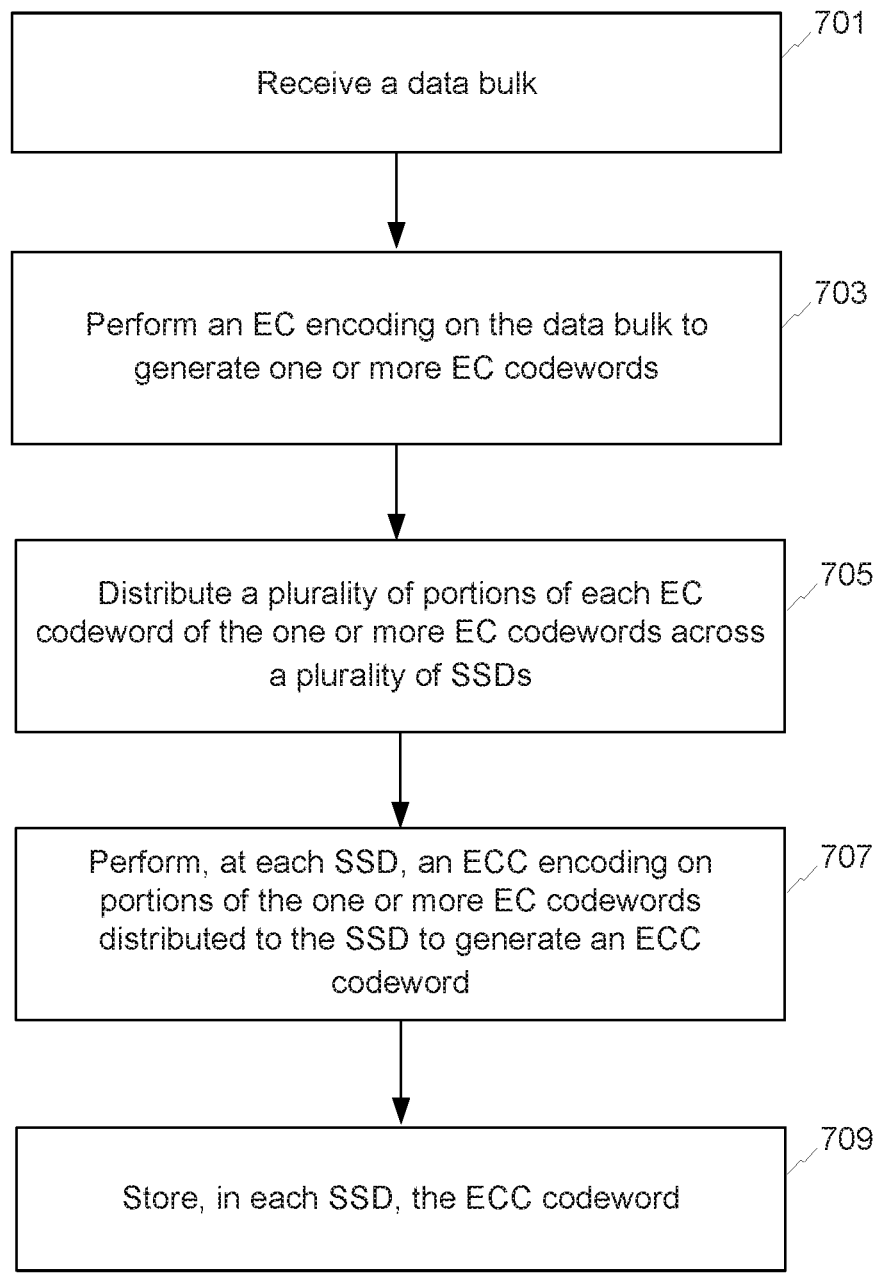
FIG. 7 is a flowchart of an exemplary encoding method, according to some embodiments of the present disclosure.

FIG. 7 is a flowchart of an exemplary encoding method 700, according to some embodiments of the present disclosure. It is appreciated that, method 700 can be implemented, at least partially, by SSD 102 of FIG. 1, NAND IC 202, NAND IC 205 and NAND IC 208 of FIG. 2, encoding system 400 of FIG. 4, and encoding process 500 of FIG. 5. Method 700 can be applied to data protection structure 600 of FIG. 6. Moreover, method 700 can also be implemented in software or firmware. For example, method 700 can be implemented by a computer program product, embodied in a computer-readable medium, including computer-executable instructions, such as program code, executed by computers. In some embodiments, a host unit (e.g., a central processing unit (CPU) or the like) may compile software code for generating instructions for providing to one or more processors to perform method 700.

At step 701, method 700 can include receiving a data bulk. For example, the data bulk can include a plurality of data blocks (e.g., data block 301) to be written to a plurality of SSD (e.g., drive 404_1, drive 404_2, . . . , drive 404_$n$).

At step 703, an EC encoding is performed on the data bulk to generate one or more EC codewords. For example, with reference to FIG. 4, EC encoder 402 can perform an EC encoding on received data bulk 401 and generate one or more EC codewords (e.g., EC codeword 403_1, EC codeword 403_2, . . . , and EC codeword 403_$p$). Each EC codeword can include an EC data and an EC parity.

At step 705, a plurality of portions of each EC codeword of the one or more EC codewords are distributed across a plurality of SSDs. In some embodiments, method 700 can include partitioning each EC codeword into a plurality of EC data portions and a plurality of EC parity portions, distributing the plurality of EC data portions of each EC codeword across a first set of SSDs, and distributing the plurality of EC parity portions of each EC codeword across a second set of SSDs. For example, with reference to FIG. 4, each EC codeword can be partitioned into n portions and distributed to n drives 404. For example, the EC data of EC codeword 403_1 can be partitioned into k portions and distributed to drive 404_1, drive 404_2, . . . , and drive 404_$k$, and the EC parity of EC codeword 403_1 can be partitioned into n-k portions and distributed to drive 404_k+1, ..., and drive 404_n. Similarly, the EC data of EC codeword 403_2, ..., and EC codeword 403_p can be partitioned into k portions and distributed to drive 404_1, drive 404_2, ..., and drive 404_k, and their EC parities can be partitioned into n-k portions and distributed to drive 404_k+1, ..., and drive 404_n. Thus, each of drive 404_1, drive 404_2, ..., and drive 404_k can receive p EC data portions from EC codeword 403_1, EC codeword 403_2, ..., and EC codeword 403_p, while each of drive 404_k+1, ..., and drive 404_n can receive p EC parity portions from EC codeword 403_1, EC codeword 403_2, ..., and EC codeword 403_p.

At step 707, at each SSD of the plurality of SSDs, an ECC encoding is performed on portions of the one or more EC codewords distributed to the SSD to generate an ECC codeword. In some embodiments, method 700 can also include performing, at each SSD of the first set of SSDs, the ECC encoding on the EC data portions of the one or more EC codewords distributed to the SSD and performing, at each SSD of the second set of SSDs, the ECC encoding on the EC parity portions of the one or more EC codewords distributed to the SSD. For example, with reference to FIG. 4, ECC encoder 4042 can perform an ECC encoding (e.g., LDPC encoding) on EC data portions or EC parity portions of EC codewords to generate an ECC codeword. For example, ECC encoder 4042_1 can encode p EC data portions of EC codewords 403_1 to 403_p to generate an ECC codeword. Similarly, ECC encoder 4042_k+1 can encode p EC parity portions of EC codewords 403_1 to 403_p to generate an ECC codeword. The ECC codeword can include an ECC data and an ECC parity.

At step 709, the ECC codeword is stored in each SSD of the plurality of SSDs. For example, with reference to FIG. 4, ECC encoder 4042_1, ECC encoder 4042_2, ..., and ECC encoder 4042_n can store respective generated ECC codeword in medium 4043_1, medium 4043_2, ..., and medium 4043_n, respectively. Medium 4043 can include a plurality of NAND ICs (e.g., NAND IC 202, 205, and 208 of FIG. 2). The NAND IC can be a SLC NAND IC, an MLC NAND IC, a TLC NAND IC, or a QLC NAND IC.

In some embodiments, method 700 can include collecting ECC parities of the ECC codewords (e.g., to one SSD of the plurality of SSDs), performing an ECC encoding on the collected ECC parities to generate a group parity, and distributing a plurality of portions of the group parity across the plurality of SSDs. For example, with reference to FIG. 4 and FIG. 5, ECC parity 4044_1, ECC parity 4044_2, ..., ECC parity 4044_i−1, ECC parity 4044_i+1, ECC parity 4044_n can be collected to a drive 404_i. ECC encoder 4042_i of drive 404_i can receive ECC parity 4044_1, ECC parity 4044_2, ..., ECC parity 4044_i−1, ECC parity 4044_i+1, ECC parity 4044_n from drive 404_1, drive 404_2, ..., drive 404_i−1, drive 404_i+1, ..., drive 404_n, respectively. In some embodiments, ECC encoder 4042_i can read ECC parity 4044_1, ECC parity 4044_2, ..., ECC parity 4044_i−1, ECC parity 4044_i+1, ECC parity 4044_n from buffer 4041_i that are collected from other drives. ECC encoder 4042_i can read ECC parity 4044_i from medium 4043_i. ECC encoder 4042_i can perform group ECC encoding on ECC parity 4044_1 to 4044_n to generate a group ECC parity. ECC encoder 4042_i can also partition the group ECC parity into n group ECC parity portions, e.g., group parity 4045_1, group parity 4045_2, ..., and group parity 4045_n. The n group ECC parity portions, group parity 4045_1, group parity 4045_2, ..., and group parity 4045_n, can be distributed to and stored in drive 404_1, drive 404_2, ..., drive 404_n, respectively. In some embodiments, the group ECC parity can be evenly partitioned into n group ECC parity portions with the same size.

Figure 8:
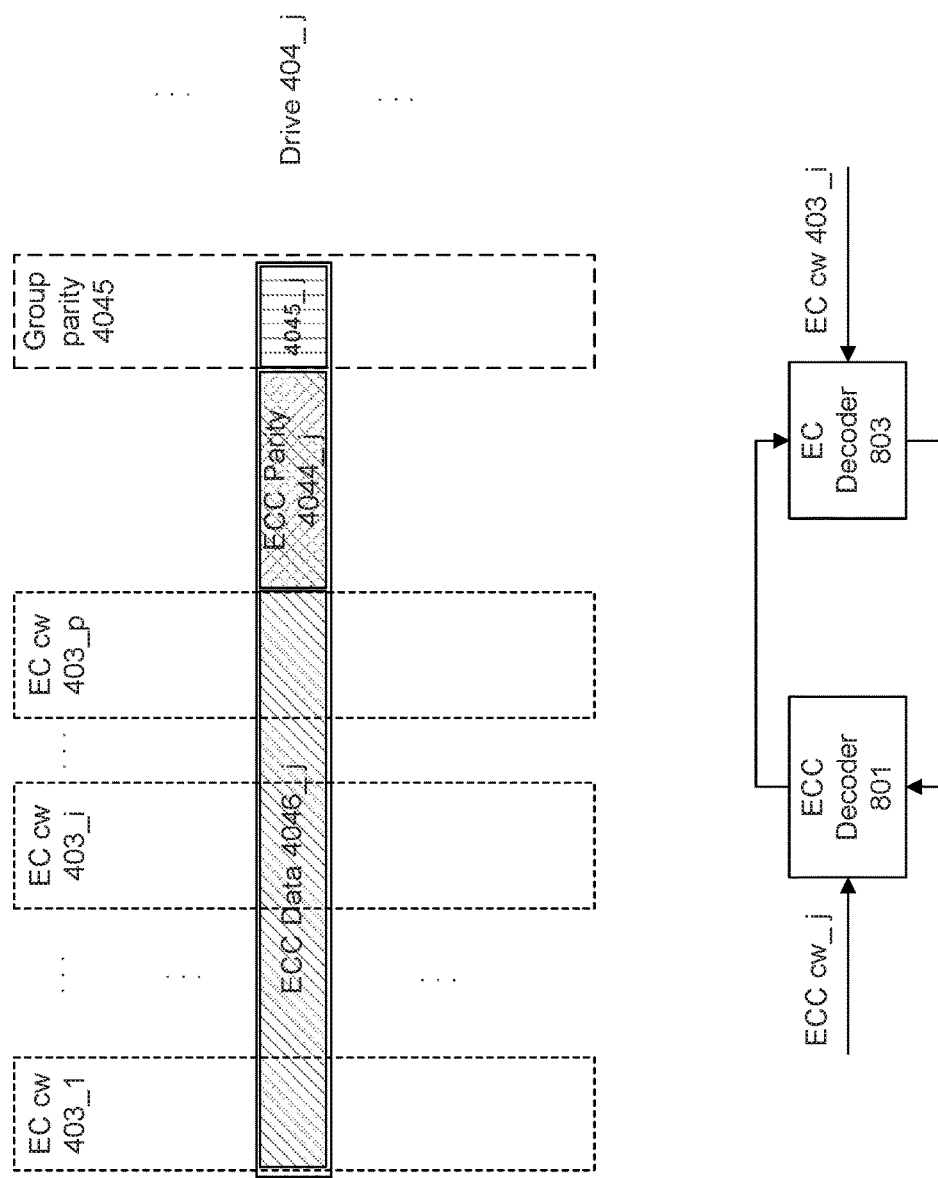
FIG. 8 illustrates a schematic representation of an exemplary decoding system, according to some embodiments of the present disclosure.

FIG. 8 illustrates a schematic representation of an exemplary decoding system 800, according to some embodiments of the present disclosure. It is appreciated that, decoding system 800 can be implemented, at least in part, by SSD 102 of FIG. 1, and applied to encoding system 400 of FIG. 4 and data protection structure 600 of FIG. 6.

As shown in FIG. 8, decoding system 800 can include an ECC decoder 801, an EC decoder 803, and the like. ECC decoder 801 can receive an ECC codeword and perform an ECC decoding on the ECC codeword. For example, ECC decoder 801 can receive an ECC codeword j (ECC cw_j as shown in FIG. 8) from drive 404_j of FIG. 4 that is corresponding to data requested by a request device. ECC codeword j can include an ECC data 4046_j and an ECC parity 4044_j. ECC decoder 801 can perform an ECC decoding on ECC codeword j by checking ECC data 4046_j with ECC parity 4044_j. If no error is found during ECC decoding or all errors are corrected by ECC decoding, ECC decoding succeeds and the decoded data is output from ECC decoder 801 to the request device. If an error is found but cannot be corrected during ECC decoding, ECC decoding fails. ECC decoder 801 can inform EC decoder 803 of the ECC failure. For example, ECC decoder 801 can send a message to EC decoder 803 to indicate the ECC failure.

After the detection of the ECC failure, EC decoder 803 can load an EC codeword 403_i, e.g., EC codeword 403_1, from the drives 404, and perform an EC decoding on the loaded EC codeword 403_i. For example, ECC decoder 803 can read k EC data portions of EC codeword 403_1 from drive 404_1, drive 404_2, ..., and drive 404_k, and read n−k EC parity portions of EC codeword 403_1 from drive 404_k+1, ..., and drive 404_n, as shown in FIG. 6. In some embodiments, the EC decoding can be performed based on a status of drive 404_j and raw ECC decoding result. If a drive 404 can provide a valid read result that may have no error or some errors, EC decoder 803 can perform a normal EC decoding. If one portion from a drive 404 has a defect, EC decoder 803 can treat this part as erasure in the EC decoding. The EC decoding can correct one or more errors in the EC codeword 403_i.

Based on the EC decoding of EC decoder 803, ECC decoder 801 can resume the ECC decoding. If the ECC decoding still fails, EC decoder 803 can load another EC codeword (e.g., EC codeword 403_2) from the drives 404, and perform another EC decoding on the loaded EC codeword. For example, ECC decoder 803 can read k EC data portions of EC codeword 403_2 from drive 404_1, drive 404_2, ..., drive 404_k, and n−k EC parity portions of EC codeword 403_2 from drive 404_k+1, ..., drive 404_n, as shown in FIG. 6. EC decoder 803 can perform an EC decoding on EC codeword 403_2 and thus correct one or more errors in EC codeword 403_2. Based on the EC decoding on EC codeword 403_2, ECC decoder 801 can resume the ECC decoding. If the ECC decoding fails, EC decoder 803 can perform next EC decoding on a next EC codeword (e.g., EC codeword 403_3). The ECC decoding and EC decoding can be iteratively performed by ECC decoder 801 and EC decoder 803, until the ECC decoding succeeds or the last EC codeword (e.g., EC codeword 403_p) is decoded. If ECC decoding succeeds, ECC decoder 801 can output the decoded data that is error-free to the request device. If base on the EC decoding of the last EC codeword, ECC decoding still fails, group decoding can be launched to reduce the number of errors in ECC parity 4044_j. For example, ECC decoder 801 can load group parity 4045 that includes a plurality of group parity portions, e.g., group parity 4045_1, group parity 4045_2, . . . , and group parity 4045_n as shown in FIG. 6, from the drives 404, e.g., drive 404_1, drive 404_2, . . . , and drive 404_n, respectively. ECC decoder 801 can perform an ECC decoding with group parity 4045 to correct one or more errors in ECC parities 4044 in the drives 404, e.g., ECC parity 4044_1 of drive 404_1, ECC parity 4044_2 of drive 404_2, . . . , and ECC parity 4044_n of drive 404_n. Based on the group decoding, another round of iterative ECC and EC decoding can be carried out similarly to that described above. If ECC decoding succeeds, ECC decoder 801 can output decoded data to request device. If ECC decoding fails after EC decoder 803 goes through all EC codewords (e.g., EC codeword 403_1, EC codeword 403_2, . . . , and EC codeword 403_p), another group decoding can be launched. ECC decoding, EC decoding and group decoding can be iteratively carried out until the ECC decoding succeeds.

In some embodiments, a threshold can be preset for an iteration count, $N_{iter}$, of the iterative ECC, EC and group decoding. If the iteration count $N_{iter}$ is more than threshold but ECC decoding still fails, the overall decoding process can be stopped and claimed as failure. The request data can be recovered from another replica.

With a combination of ECC and EC decoding or ECC, EC and group decoding, some embodiments of the present disclosure can enhance data reliability in SSD and provide improved data protection.

It is appreciated that ECC decoder 801 and EC decoder 803 can be implemented by hardware, software, firmware, or the combination thereof. For example, ECC decoder 801 can have circuitry configured to decode an ECC codeword (e.g., ECC codeword j) and perform ECC decoding with group parity (e.g., group parity 4045), and EC decoder 803 can have circuitry configured to decode an EC codeword (e.g., EC codeword 403_i). Although shown as separate components, ECC decoder 801 and EC decoder 803 can be integrated into a single decoder.

Figure 9:
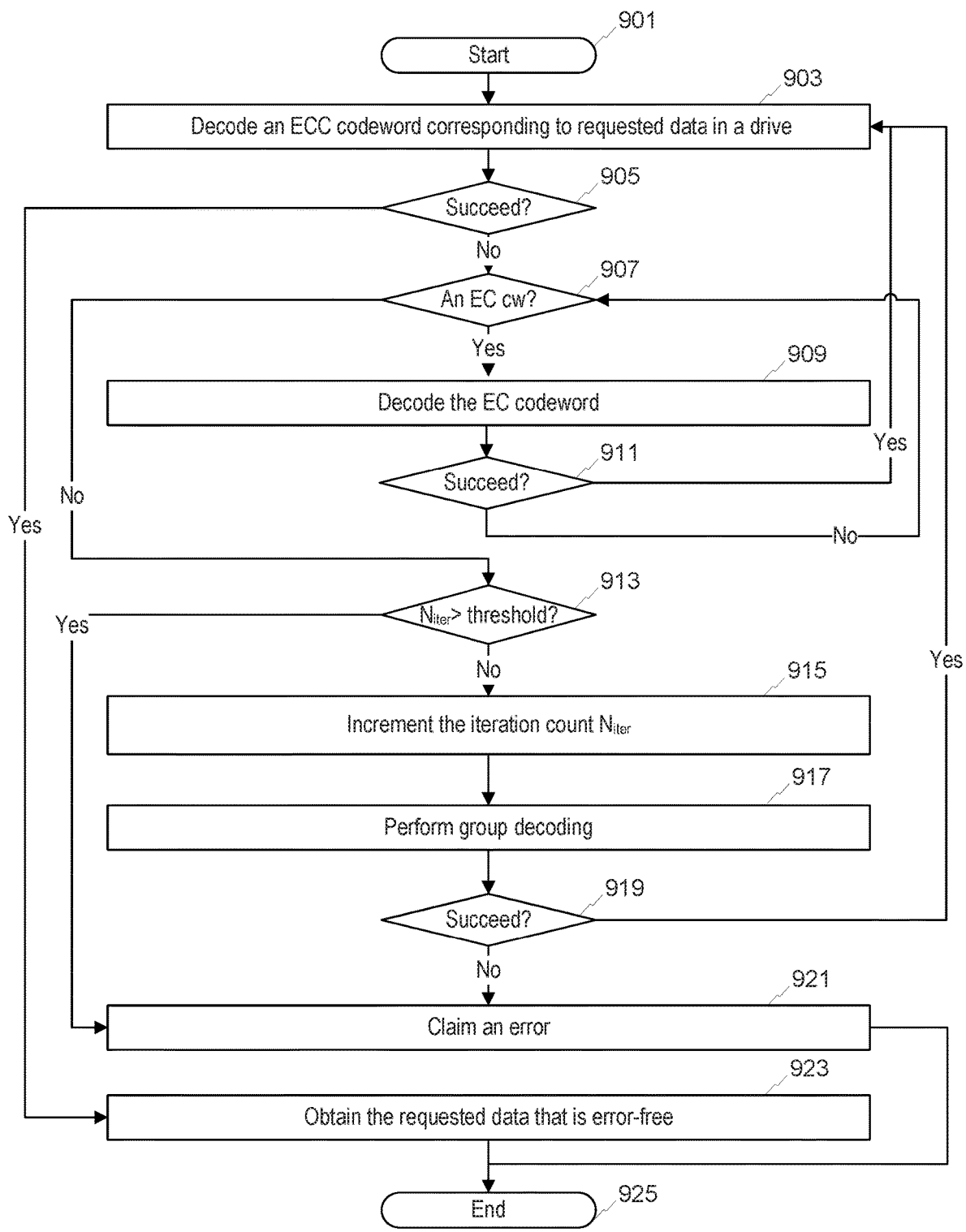
FIG. 9 illustrates a flowchart of an exemplary decoding method, according to some embodiments of the present disclosure.

FIG. 9 illustrates a flowchart of an exemplary decoding method 900, according to some embodiments of the present disclosure. It is appreciated that, method 900 can be implemented, at least partially, by SSD 102 of FIG. 1, NAND IC 202, NAND IC 205 and NAND IC 208 of FIG. 2, and decoding system 800 of FIG. 8. Method 900 can be applied to data protection structure 600 of FIG. 6. Moreover, method 900 can also be implemented in software or firmware. For example, method 900 can be implemented by a computer program product, embodied in a computer-readable medium, including computer-executable instructions, such as program code, executed by computers. In some embodiments, a host unit (e.g., a central processing unit (CPU) or the like) may compile software code for generating instructions for providing to one or more processors to perform method 900.

As shown in FIG. 9, method 900 starts at step 901. For example, method 900 can be initiated with a data request (e.g., a read operation) from a request device. At step 903, an ECC codeword corresponding to requested data in a drive can be decoded. For example, with reference to FIG. 8, ECC decoder 801 can receive an ECC codeword j from drive 404_j of FIG. 4 that is corresponding to data requested by the request device. ECC codeword j can include an ECC data 4046_j and an ECC parity 4044_j. ECC decoder 801 can perform an ECC decoding on ECC codeword j by checking ECC data 4046_j with ECC parity 4044_j.

At step 905, a determination is made on whether the ECC decoding has succeeded. If the ECC decoding has succeeded (e.g., no error is found during ECC decoding or all errors are corrected by ECC decoding), method 900 proceeds to step 923 where the error-free requested data is obtained. If the ECC decoding has failed (e.g., an error is found but cannot be corrected during ECC decoding), method 900 proceeds to step 907.

At step 907, a determination is made on whether there is an EC codeword that is not decoded. If there is an EC codeword left, method 900 proceeds to step 909 where EC decoding can be performed on the EC codeword. In some embodiments, a pointer can be utilized to indicate the EC codeword to be EC decoded. If current ECC codeword is EC decoded at step 909, the pointer can move to next EC codeword for EC decoding.

At step 909, the EC codeword is decoded. For example, with reference to FIG. 8, EC decoder 803 can load an EC codeword 403_1, from the drives 404_1, and perform an EC decoding on the loaded EC codeword 403_1. ECC decoder 803 can read k EC data portions of EC codeword 403_1 from drive 404_1, drive 404_2, . . . , and drive 404_k, and read n-k EC parity portions of EC codeword 403_1 from drive 404_k+1, . . . , and drive 404_n, as shown in FIG. 6. EC decoder 803 can check k EC data portions of EC codeword 403_1 with n-k EC parity portions of EC codeword 403_1 to decode EC codeword 403_1. In some embodiments, the EC decoding can be performed based on a status of drive 404_j and raw ECC decoding result. If a drive 404 can provide a valid read result that may have no error or some errors, EC decoder 803 can perform a normal EC decoding. If one portion from a drive 404 has a defect, EC decoder 803 can treat this part as erasure in the EC decoding. The EC decoding can correct one or more errors in the EC codeword 403_1 and may reduce errors in ECC codeword j. The EC decoding may facilitate recovery of ECC data part in ECC codeword j corresponding to the EC codeword 403_1.

At step 911, a determination is made on whether the EC decoding has succeeded. If the EC decoding has succeeded, method 900 proceeds back to step 903 where the ECC decoding can be resumed. If it is determined that the ECC decoding has failed at step 905, method proceeds to step 907 that determines whether there is another EC codeword that can be decoded. If there is another EC codeword (e.g., EC codeword 403_2), an EC decoding can be performed on the EC codeword. For example, with reference to FIG. 8, ECC decoder 803 can read k EC data portions of EC codeword 403_2 from drive 404_1, drive 404_2, . . . , and drive 404_k, and n-k EC parity portions of EC codeword 403_2 from drive 404_k+1, . . . , and drive 404_n, as shown in FIG. 6. EC decoder 803 can perform an EC decoding on EC codeword 403_2 and thus correct one or more errors in EC codeword 403_2.

If at step 907, there are no more EC codewords to be decoded (e.g., the pointer goes through all EC codewords), method 900 proceeds to step 913 where a determination is made on whether an iteration count $N_{iter}$ of the iterative ECC, EC and group decoding is greater than a preset threshold. Iteration count $N_{iter}$ can indicate a preset number of iterations allowed within a given time frame. If the iteration count $N_{iter}$ is larger than the threshold, method 900 proceeds to step 921 where an error is claimed. If the iteration count $N_{iter}$ is not larger than the threshold, method 900 proceeds to step 915. At step 915, the iteration count $N_{iter}$ is incremented to track the total number of ECC, EC and group decoding iterations.

At step 917, a group decoding is performed. For example, with reference to FIG. 8, ECC decoder 801 can load group parity 4045 that includes group parity 4045_1, group parity 4045_2, . . . , and group parity 4045_n, from drive 404_1, drive 404_2, . . . , and drive 404_n, respectively, as shown in FIG. 6. ECC decoder 801 can perform an ECC decoding with group parity 4045 to correct one or more errors in ECC parity 4044_1 of drive 404_1, ECC parity 4044_2 of drive 404_2, . . . , and ECC parity 4044_n of drive 404_n.

At step 919, a determination is made on whether the group decoding has succeeded. If the group decoding has succeeded, method 900 proceeds to step 903 where the ECC decoding on the ECC codeword can be resumed. Then, based on the group decoding, another round of iterative ECC and EC decoding (e.g., steps 903-911) can be carried out. During the iterative ECC and EC decoding, if ECC decoding has succeeded at step 905, method 900 proceeds to step 923 where the error-free requested data is obtained. If ECC decoding has failed at 905 and it is determined, at step 907, that all EC codewords (e.g., EC codeword 403_1, EC codeword 403_2, . . . , and EC codeword 403_p) are decoded, method 900 proceeds to step 913 to launch another group decoding (e.g., steps 913-919). ECC decoding, EC decoding, and group decoding can be iteratively carried out until the ECC decoding has succeeded or the iteration count $N_{iter}$ is larger than the threshold.

If it is determined at step 919 that the group decoding has failed, method 900 proceeds to step 921 where an error is claimed. The claimed error can indicate an overall failure of the decoding process. Method 900 proceeds to step 925 where the decoding process ends. In some embodiments, the request data can be recovered from another replica.

Embodiments of the present disclosure can improve data protection of SSD by collaborating EC, ECC, or parity protection to construct error reduction and correction with converged trend within given time frame. Some embodiments of the present disclosure can reuse the EC across multiple drives, switch between erasure decoding and normal decoding of both EC and ECC, utilize overall parity protection, and enhance converged noise reduction.

Embodiments of the present disclosure can be applied to many products. For example, some embodiments of the present disclosure can be applied to Ali-NPU (e.g., Hanguang NPU), Ali-Cloud, Ali PIM-AI (Processor-in Memory for AI), Ali-DPU (Database Acceleration Unit), Ali-AI platform, Ali-Data Center AI Inference Chip, IoT Edge AI Chip, GPU, TPU, or the like.

The embodiments may further be described using the following clauses:

1. A method for data encoding, comprising:
receiving a data bulk;
performing an erasure coding (EC) encoding on the data bulk to generate one or more EC codewords;
distributing a plurality of portions of each EC codeword of the one or more EC codewords across a plurality of solid-state drives (SSDs);
performing, at each SSD of the plurality of SSDs, an error correction coding (ECC) encoding on portions of the one or more EC codewords distributed to the SSD to generate an ECC codeword; and
storing, in each SSD of the plurality of SSDs, the ECC codeword.

2. The method of clause 1, further comprising:
collecting ECC parities of the ECC codewords;
performing an ECC encoding on the collected ECC parities to generate a group parity; and
distributing a plurality of portions of the group parity across the plurality of SSDs.

3. The method of clause 2, wherein collecting the ECC parities of the ECC codewords comprises:
collecting the ECC parities of the ECC codewords to one SSD of the plurality of SSDs.

4. The method of any one of clauses 1-3, wherein distributing the plurality of portions of each EC codeword of the one or more EC codewords across the plurality of SSDs comprises:
partitioning each EC codeword into a plurality of EC data portions and a plurality of EC parity portions;
distributing the plurality of EC data portions of each EC codeword across a first set of SSDs; and
distributing the plurality of EC parity portions of each EC codeword across a second set of SSDs.

5. The method of clause 4, wherein performing, at each SSD of the plurality of SSDs, the ECC encoding on portions of the one or more EC codewords distributed to the SSD comprises:
performing, at each SSD of the first set of SSDs, the ECC encoding on the EC data portions of the one or more EC codewords distributed to the SSD; and
performing, at each SSD of the second set of SSDs, the ECC encoding on the EC parity portions of the one or more EC codewords distributed to the SSD.

6. The method of any one of clauses 1-5, wherein storing, in each SSD of the plurality of SSDs, the ECC codeword comprises:
storing the ECC codeword in a NAND IC of each SSD of the plurality of SSDs.

7. An apparatus for data encoding, comprising:
at least one memory for storing instructions; and
at least one processor configured to execute the instructions to cause the apparatus to perform:
receiving a data bulk;
performing an erasure coding (EC) encoding on the data bulk to generate one or more EC codewords;
distributing a plurality of portions of each EC codeword of the one or more EC codewords across a plurality of solid-state drives (SSDs);
performing, at each SSD of the plurality of SSDs, an error correction coding (ECC) encoding on portions of the one or more EC codewords distributed to the SSD to generate an ECC codeword; and
storing, in each SSD of the plurality of SSDs, the ECC codeword.

8. The apparatus of clause 7, wherein the at least one processor is configured to execute the instructions to cause the apparatus to perform:
collecting ECC parities of the ECC codewords;
performing an ECC encoding on the collected ECC parities to generate a group parity; and
distributing a plurality of portions of the group parity across the plurality of SSDs.

9. The apparatus of clause 8, wherein the at least one processor is configured to execute the instructions to cause the apparatus to perform:
collecting the ECC parities of the ECC codewords to one SSD of the plurality of SSDs.

10. The apparatus of any one of clauses 7-9, wherein the at least one processor is configured to execute the instructions to cause the apparatus to perform:
partitioning each EC codeword into a plurality of EC data portions and a plurality of EC parity portions;

distributing the plurality of EC data portions of each EC codeword across a first set of SSDs; and distributing the plurality of EC parity portions of each EC codeword across a second set of SSDs.

11. The apparatus of clause 10, wherein the at least one processor is configured to execute the instructions to cause the apparatus to perform:

performing, at each SSD of the first set of SSDs, the ECC encoding on the EC data portions of the one or more EC codewords distributed to the SSD; and performing, at each SSD of the second set of SSDs, the ECC encoding on the EC parity portions of the one or more EC codewords distributed to the SSD.

12. The apparatus of any one of clauses 7-11, wherein the at least one processor is configured to execute the instructions to cause the apparatus to perform:

storing the ECC codeword in a NAND IC of each SSD of the plurality of SSDs.

13. A non-transitory computer readable storage medium storing a set of instructions that are executable by one or more processing devices to cause a computer to perform:

receiving a data bulk;

performing an erasure coding (EC) encoding on the data bulk to generate one or more EC codewords;

distributing a plurality of portions of each EC codeword of the one or more EC codewords across a plurality of solid-state drives (SSDs);

performing, at each SSD of the plurality of SSDs, an error correction coding (ECC) encoding on portions of the one or more EC codewords distributed to the SSD to generate an ECC codeword; and storing, in each SSD of the plurality of SSDs, the ECC codeword.

14. The non-transitory computer readable storage medium of clause 13, wherein the set of instructions are executable by the one or more processing devices to cause the computer to perform:

collecting ECC parities of the ECC codewords;

performing an ECC encoding on the collected ECC parities to generate a group parity; and distributing a plurality of portions of the group parity across the plurality of SSDs.

15. The non-transitory computer readable storage medium of clause 14, wherein the set of instructions are executable by the one or more processing devices to cause the computer to perform:

collecting the ECC parities of the ECC codewords to one SSD of the plurality of SSDs.

16. The non-transitory computer readable storage medium of any one of clauses 13-15, wherein the set of instructions are executable by the one or more processing devices to cause the computer to perform:

partitioning each EC codeword into a plurality of EC data portions and a plurality of EC parity portions;

distributing the plurality of EC data portions of each EC codeword across a first set of SSDs; and distributing the plurality of EC parity portions of each EC codeword across a second set of SSDs.

17. The non-transitory computer readable storage medium of clause 16, wherein the set of instructions are executable by the one or more processing devices to cause the computer to perform:

performing, at each SSD of the first set of SSDs, the ECC encoding on the EC data portions of the one or more EC codewords distributed to the SSD; and performing, at each SSD of the second set of SSDs, the ECC encoding on the EC parity portions of the one or more EC codewords distributed to the SSD.

18. The non-transitory computer readable storage medium of any one of clauses 13-17, wherein the set of instructions are executable by the one or more processing devices to cause the computer to perform:

storing the ECC codeword in a NAND IC of each SSD of the plurality of SSDs.

19. A method for data decoding, comprising:

initiating an error correction coding (ECC) decoding on an ECC codeword to generate decoded data;

determining whether the ECC decoding on the ECC codeword has succeeded or failed;

in response to a determination that the ECC decoding has failed, initiating an erasure coding (EC) decoding on a first EC codeword of a plurality of EC codewords, each EC codeword corresponding to an ECC data portion of the ECC codeword;

determining whether the EC decoding on the first EC codeword has succeeded or failed;

in response to a determination that the EC decoding has succeeded, resuming the ECC decoding on the ECC codeword; and in response to a determination that the ECC decoding has succeeded, outputting the decoded data.

20. The method of clause 19, further comprising:

in response to a determination that the EC decoding has failed, initiating an EC decoding on a second EC codeword of the plurality of EC codewords.

21. The method of clause 19, further comprising:

in response to a determination that the resumed ECC decoding has failed, initiating an EC decoding on a second EC codeword of the plurality of EC codewords.

22. The method of any one of clauses 19-21, wherein initiating an EC decoding on the first or second EC codeword comprises:

loading a plurality of portions of the first or second EC codeword from a plurality of solid-state drives (SSDs).

23. The method of clause 22, wherein initiating the EC decoding comprises:

performing an EC decoding in response to a first SSD providing a valid read result; and performing an erasure EC decoding in response to a second SSD providing a portion with defect.

24. The method of any one of clauses 19-23, further comprising:

determining whether there is an EC codeword in the plurality of EC codewords that is not decoded;

in response to a determination that there is no EC codeword that is not decoded, initiating a group decoding with a group parity.

25. The method of clause 24, wherein initiating the group decoding with the group parity comprises:

loading a plurality of group parity portions and ECC parities of ECC codewrods from a plurality of SSDs; and performing an ECC decoding on the ECC parities of ECC codewrods with the group parity.

26. The method of clause 24 or 25, further comprising:

determining whether the group decoding has succeeded or failed; and in response to a determination that the group decoding has succeeded, resuming the ECC decoding.

27. The method of clause 26, further comprising:

in response to a determination that the group decoding has failed, outputting an error.

28. The method of any one of clause 24-27, further comprising:
    determining whether an iteration number of the ECC, EC and group decoding is larger than a threshold; and
    in response to the iteration number being determined to be larger than the threshold, outputting an error.
29. An apparatus for data decoding, comprising:
    at least one memory for storing instructions; and
    at least one processor configured to execute the instructions to cause the apparatus to perform:
        initiating an error correction coding (ECC) decoding on an ECC codeword to generate decoded data;
        determining whether the ECC decoding on the ECC codeword has succeeded or failed;
        in response to a determination that the ECC decoding has failed, initiating an erasure coding (EC) decoding on a first EC codeword of a plurality of EC codewords, each EC codeword corresponding to an ECC data portion of the ECC codeword;
        determining whether the EC decoding on the first EC codeword has succeeded or failed;
        in response to a determination that the EC decoding has succeeded, resuming the ECC decoding on the ECC codeword; and
        in response to a determination that the ECC decoding has succeeded, outputting the decoded data.
30. The apparatus of clause 29, wherein the at least one processor is configured to execute the instructions to cause the apparatus to perform:
    in response to a determination that the EC decoding has failed, initiating an EC decoding on a second EC codeword of the plurality of EC codewords.
31. The apparatus of clause 29, wherein the at least one processor is configured to execute the instructions to cause the apparatus to perform:
    in response to a determination that the resumed ECC decoding has failed, initiating an EC decoding on a second EC codeword of the plurality of EC codewords.
32. The apparatus of any one of clauses 29-31, wherein the at least one processor is configured to execute the instructions to cause the apparatus to perform:
    loading a plurality of portions of the first or second EC codeword from a plurality of solid-state drives (SSDs).
33. The apparatus of clause 32, wherein the at least one processor is configured to execute the instructions to cause the apparatus to perform:
    performing an EC decoding in response to a first SSD providing a valid read result; and
    performing an erasure EC decoding in response to a second SSD providing a portion with defect.
34. The apparatus of any one of clauses 29-33, wherein the at least one processor is configured to execute the instructions to cause the apparatus to perform:
    determining whether there is an EC codeword in the plurality of EC codewords that is not decoded;
    in response to a determination that there is no EC codeword that is not decoded, initiating a group decoding with a group parity.
35. The apparatus of clause 34, wherein the at least one processor is configured to execute the instructions to cause the apparatus to perform:
    loading a plurality of group parity portions and ECC parities of ECC codewrods from a plurality of SSDs; and
    performing an ECC decoding on the ECC parities of ECC codewrods with the group parity.
36. The apparatus of clause 34 or 35, wherein the at least one processor is configured to execute the instructions to cause the apparatus to perform:
    determining whether the group decoding has succeeded or failed; and
    in response to a determination that the group decoding has succeeded, resuming the ECC decoding.
37. The apparatus of clause 36, wherein the at least one processor is configured to execute the instructions to cause the apparatus to perform:
    in response to a determination that the group decoding has failed, outputting an error.
38. The apparatus of any one of clause 34-37, wherein the at least one processor is configured to execute the instructions to cause the apparatus to perform:
    determining whether an iteration number of the ECC, EC and group decoding is larger than a threshold; and
    in response to the iteration number being determined to be larger than the threshold, outputting an error.
39. A non-transitory computer readable storage medium storing a set of instructions that are executable by one or more processing devices to cause a computer to perform:
    initiating an error correction coding (ECC) decoding on an ECC codeword to generate decoded data;
    determining whether the ECC decoding on the ECC codeword has succeeded or failed;
    in response to a determination that the ECC decoding has failed, initiating an erasure coding (EC) decoding on a first EC codeword of a plurality of EC codewords, each EC codeword corresponding to an ECC data portion of the ECC codeword;
    determining whether the EC decoding on the first EC codeword has succeeded or failed;
    in response to a determination that the EC decoding has succeeded, resuming the ECC decoding on the ECC codeword; and
    in response to a determination that the ECC decoding has succeeded, outputting the decoded data.
40. The non-transitory computer readable storage medium of clause 39, wherein the at least one processor is configured to execute the instructions to cause the apparatus to perform:
    in response to a determination that the EC decoding has failed, initiating an EC decoding on a second EC codeword of the plurality of EC codewords.
41. The non-transitory computer readable storage medium of clause 39, wherein the at least one processor is configured to execute the instructions to cause the apparatus to perform:
    in response to a determination that the resumed ECC decoding has failed, initiating an EC decoding on a second EC codeword of the plurality of EC codewords.
42. The non-transitory computer readable storage medium of any one of clauses 39-41, wherein the at least one processor is configured to execute the instructions to cause the apparatus to perform:
    loading a plurality of portions of the first or second EC codeword from a plurality of solid-state drives (SSDs).
43. The non-transitory computer readable storage medium of clause 42, wherein the at least one processor is configured to execute the instructions to cause the apparatus to perform:
    performing an EC decoding in response to a first SSD providing a valid read result; and
    performing an erasure EC decoding in response to a second SSD providing a portion with defect.
44. The non-transitory computer readable storage medium of any one of clauses 39-43, wherein the at least one processor is configured to execute the instructions to cause the apparatus to perform:

determining whether there is an EC codeword in the plurality of EC codewords that is not decoded;

in response to a determination that there is no EC codeword that is not decoded, initiating a group decoding with a group parity.

45. The non-transitory computer readable storage medium of clause 44, wherein the at least one processor is configured to execute the instructions to cause the apparatus to perform:

loading a plurality of group parity portions and ECC parities of ECC codewrods from a plurality of SSDs; and performing an ECC decoding on the ECC parities of ECC codewrods with the group parity.

46. The non-transitory computer readable storage medium of clause 44 or 45, wherein the at least one processor is configured to execute the instructions to cause the apparatus to perform:

determining whether the group decoding has succeeded or failed; and in response to a determination that the group decoding has succeeded, resuming the ECC decoding.

47. The non-transitory computer readable storage medium of clause 46, wherein the at least one processor is configured to execute the instructions to cause the apparatus to perform:

in response to a determination that the group decoding has failed, outputting an error.

48. The non-transitory computer readable storage medium of any one of clause 44-47, wherein the at least one processor is configured to execute the instructions to cause the apparatus to perform:

determining whether an iteration number of the ECC, EC and group decoding is larger than a threshold; and in response to the iteration number being determined to be larger than the threshold, outputting an error.

The various example embodiments described herein are described in the general context of method steps or processes, which may be implemented in one aspect by a computer program product, embodied in a computer readable medium, including computer-executable instructions, such as program code, executed by computers in networked environments. A computer readable medium may include removeable and nonremovable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware, but systems and methods consistent with the present disclosure can be implemented with hardware and software. In addition, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

The features and advantages of the present disclosure are apparent from the detailed specification, and thus, it is intended that the appended claims cover all systems and methods falling within the true spirit and scope of the present disclosure. As used herein, the indefinite articles "a" and "an" mean "one or more." Further, since numerous modifications and variances will readily occur from studying the present disclosure, it is not desired to limit the present disclosure to the exact reconstruction and operation illustrated and described, and accordingly, all suitable modifications and equivalents may be resorted to, falling within the scope of the present disclosure.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. A method for data decoding, comprising:
    initiating an error correction coding (ECC) decoding on an ECC codeword to generate decoded data;
    determining whether the ECC decoding on the ECC codeword has succeeded or failed;
    in response to a determination that the ECC decoding has failed, initiating an erasure coding (EC) decoding on a first EC codeword of a plurality of EC codewords, each EC codeword corresponding to an ECC data portion of the ECC codeword;
    determining whether the EC decoding on the first EC codeword has succeeded or failed;
    in response to a determination that the EC decoding has succeeded, resuming the ECC decoding on the ECC codeword; and
    in response to a determination that the ECC decoding has succeeded, outputting the decoded data.

2. The method of claim 1, further comprising:
    in response to a determination that the EC decoding has failed, initiating an EC decoding on a second EC codeword of the plurality of EC codewords.

3. The method of claim 1, further comprising:
    in response to a determination that the resumed ECC decoding has failed, initiating an EC decoding on a second EC codeword of the plurality of EC codewords.

4. The method of claim 1, further comprising:
determining whether there is an EC codeword in the plurality of EC codewords that is not decoded;
in response to a determination that there is no EC codeword that is not decoded, initiating a group decoding with a group parity.

5. The method of claim 4, wherein initiating the group decoding with the group parity comprises:
loading a plurality of group parity portions and ECC parities of ECC codewrods from a plurality of SSDs; and
performing an ECC decoding on the ECC parities of ECC codewrods with the group parity.

6. The method of claim 4, further comprising:
determining whether the group decoding has succeeded or failed; and
in response to a determination that the group decoding has succeeded, resuming the ECC decoding.

7. The method of claim 6, further comprising:
in response to a determination that the group decoding has failed, outputting an error.

8. The method of claim 4, further comprising:
determining whether an iteration number of the ECC, EC and group decoding is larger than a threshold; and
in response to the iteration number being determined to be larger than the threshold, outputting an error.

* * * * *